United States Patent [15] 3,693,112
Briggs [45] Sept. 19, 1972

[54] SIGNAL CONTROLLED WIDE RANGE RELAXATION OSCILLATOR APPARATUS

[72] Inventor: Barry D. Briggs, Cedar Rapids, Iowa

[73] Assignee: Collins Radio Company, Dallas, Tex.

[22] Filed: March 12, 1971

[21] Appl. No.: 123,499

[52] U.S. Cl. ................331/111, 331/153, 331/177 R
[51] Int. Cl. ............................H03b 3/04, H03k 3/28
[58] Field of Search.....331/111, 143, 153, 177 R, 34

[56] References Cited

UNITED STATES PATENTS 3,559,098 1/1971 Chandos ...........331/177 R X
3,621,469 11/1971 Bauer .......................331/111

*Primary Examiner*—Roy Lake
*Assistant Examiner*—Siegfried H. Grimm
*Attorney*—Robert J. Crawford and Bruce C. Lutz

[57] ABSTRACT

A wide range oscillator which can operate over approximately a $10^4$ frequency range. The oscillator uses a current controlled ramp generator which varies the charging rate of an integrating capacitor. The wide range of charging current plus a low discharge time of the integrating capacitor combines to enable a very wide frequency range oscillator.

7 Claims, 2 Drawing Figures

Figures 1, 2:
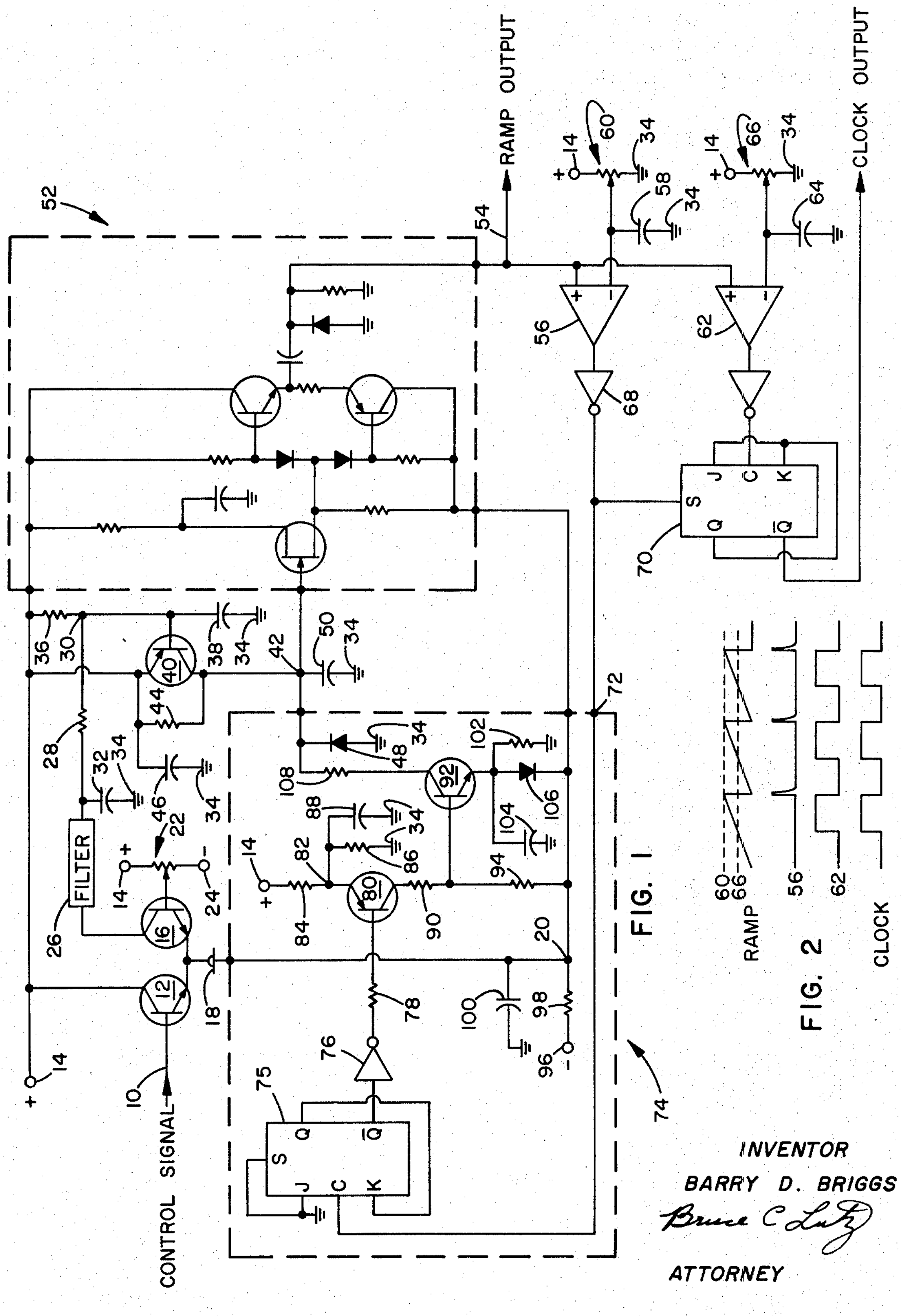

INVENTOR
BARRY D. BRIGGS
Bruce C Lutz
ATTORNEY

SIGNAL CONTROLLED WIDE RANGE RELAXATION OSCILLATOR APPARATUS

The present invention is generally directed towards electronics and more specifically towards variable frequency oscillators. Even more specifically the invention is directed toward a current controlled oscillator.

There are many different types of oscillators in the prior art that can be varied over a frequency range. However, most of these do not vary over a very wide frequency range. One embodiment of the circuit shown in the present invention is variable from 300 Hz to 6 MHz. This results in a frequency variation of approximately $10^4$.

It is therefore an object of the present invention to provide an improved oscillating circuit which may be varied in frequency in accordance with an input signal.

Other objects and advantages of the present invention may be ascertained from a reading of the specification and appended claims in conjunction with the drawings wherein:

FIG. 1 is a schematic diagram of one embodiment of the invention;

FIG. 2 comprises a plurality of waveforms for use in illustrating the description of FIG. 1.

An error or control input signal is applied to terminal 10 which is connected to the base of a transistor 12 having its collector connected to a positive power supply 14 and its emitter connected to an emitter of a further transistor 16. The two emitters are also connected to one terminal of a field effect current limiting diode 18 which is used to provide a constant current limiter and has its other terminal connected to a junction point 20. A base of transistor 16 is connected to a wiper of a variable potentiometer designated as 22 and connected between positive and negative potentials 14 and 24. The collector of transistor 16 is connected through a filter 26 and a resistor or impedance means 28 to a junction point 30. A capacitor 32 is connected from the output of filter 26 to ground or reference potential 34. A resistor 36 is connected between junction point 30 and positive power supply 14 while a capacitor 38 is connected between junction point 30 and ground 34. A PNP transistor 40 has its base connected to junction point 30 and its emitter connected to positive power terminal 14. A collector of transistor 40 is connected to a junction point 42. An impedance 44 is connected between the emitter and collector terminals of transistor 40 while a capacitor 46 is connected between the emitter of transistor 40 and ground 34. A diode 48 and a capacitor 50 are connected in parallel between junction point 42 and ground 34. Junction point 42 is also connected to the input of an amplifier generally designated as 52 and enclosed by dash lines. The amplifier may be any amplifier which will accurately reproduce a ramp voltage between the necessary frequencies involved. Since other amplifiers are available for such a purpose, the electrical schematic of a usable amplifier will be shown but will not be described. The output of amplifier 52 is designated as a ramp output 54. Output 54 of this amplifier is also supplied as an input to a noninverting input of a differential amplifier generally designated as 56. Amplifier 56 has its inverting input connected through a capacitor 58 to ground 34 and is also connected to a wiper of a potentiometer generally designated as 60 and connected between positive power terminal 14 and ground 34. Output 54 is connected to another differential amplifier 62 which is connected to a further capacitor 64 and a further potentiometer 66 in a manner similar to that of amplifier 56. An output of amplifier 56 is connected through an inverting amplifier 68 to a set input of a J-K flip-flop 70 and also to an input 72 of a block generally designated as 74. Flip-flop 70 receives a clock input, as shown, from amplifier 62. The block 74 comprises a one-shot switch which will be somewhat further described. Terminal 72 is connected to a clock input of a J-K flip-flop 75. Flip-flop 75 is connected to provide a one-shot multivibrator in the manner disclosed in a co-pending application Ser. No. 121,426 filed Mar. 5, 1971 in the name of James R. Perry and entitled One-Shot Multivibrator Apparatus. The $\overline{Q}$ output of flip-flop 75 is supplied through an inverting amplifier 76 and an impedance 78 to the base of a transistor generally designated as 80. Transistor 80 has its emitter connected to a junction point 82 of a voltage dividing network comprising resistors 84 and 86 connected between positive power potential 14 and ground 34. A capacitor 88 is connected between junction point 82 and ground 34 in parallel with resistor 86. A collector of PNP transistor 80 is connected through a resistor 90 to a base of a NPN transistor generally designated as 92. The base of transistor 92 is also connected to junction point 20 through a resistor 94. Junction point 20 is connected to a negative power potential 96 through a resistor 98. A capacitor 100 is connected to ground and to junction point 20. An emitter of transistor 92 is connected to ground through a parallel connection of an impedance 102 and a capacitor 104. The emitter of transistor 92 is also connected, through a diode 106, to junction point 20. The collector of transistor 92 is connected through a resistive impedance 108 to junction point 42.

An input error or control signal is supplied to input terminal 10. The differential amplifier comprising transistors 12 and 16 may be advantageously used if the input contains an offset from ground in the minimum input condition. Thus, the potentiometer 22 is provided to compensate for any offset in the error signal and the filter comprising block 26, along with impedance 28 and capacitor 32, is used to filter out any noise signals and ripple from the error signal. The filtered and amplitude adjusted signals are then applied to the base of constant current generator 40. The input signals at terminal or junction point 30 determine the amount of current through the constant current transistor 40. The current through this transistor charges capacitor 50 in a linear fashion as long as the amplitude does not exceed a predetermined value. The resistor 44 bypasses transistor 40 to provide a minimum oscillation frequency. In one embodiment of the invention this transistor was approximately 40 Megohms. The ramp signal is impedance buffered and D-C restored in amplifier 52 and supplied to the input of differential amplifier 56. When the ramp exceeds the voltage set by potentiometer 60 the output of amplifier 56 will suddenly switch from a negative to a positive value. This output is inverted by inverter 68 and utilized to clock the J-K flip-flop 75. As explained in the above-referenced, co-pending application, the clock at the input of J-K flip-flop 75 will result in a positive going output at the $\overline{Q}$ terminal. The $\overline{Q}$ terminal is normally at ground potential which when inverted supplies a positive potential to the base of transistor 80. This keeps the transistor 80 in a normally OFF condition which prevents current flow to transistor 92 and thus keeps this transistor in an OFF condition. The positive pulse appearing at the output of the $\overline{Q}$ terminal of J-K flip-flop 75 results in a negative pulse being applied to transistor 80 thereby momentarily turning it ON and accordingly actuating the switching transistor 92. The actuation of this transistor discharges the capacitor 50 since it is connected to negative power supply 96 for a short period of time. Diode 48 prevents the capacitor 50 from being discharged to greater than 0.6 of a volt below ground potential. As soon as the capacitor starts to discharge, the output of amplifier 52 starts to drop and lowers the potential at the noninverting input of amplifier 56 below that supplied to the inverting input by potentiometer 60. Thus, the output of amplifier 56 drops and the clock is no longer supplied to J-K flip-flop 75. The J-K flip-flop 75 only supplies a predetermined width output pulse in the connection shown and thus the output from amplifier 56 has no effect in turning OFF the J-K flip-flop 75 or the associated transistor switches 80 and 92. However, since the capacitor 50 is discharged to a standard −0.6 volt on each occasion, it always is able to start from the same reference and again charge linearly until such time as it is again at the set or predetermined amplitude.

Reference to FIG. 2 will illustrate the output pulse from amplifier 56 coinciding with the reaching of the potential 60 by the ramp output.

It will also be noted that amplifier 62 produces an output signal when the ramp reaches a value which is, as shown, half-way between the minimum and maximum ramp potentials. The pulse output is inverted by the inverter and applied to the clock input of J-K flip-flop 70 which produces a positive output from the $\overline{Q}$ terminal. When the ramp reaches its full potential and an output is obtained from inverter 68, the negative pulse applied to the set input changes the Q output back to a ground or negative potential.

It can thus be determined that the output from this oscillator may be either a ramp voltage or a square wave voltage. It may also be determined that by varying the potential from potentiometer 66 the square wave output may be varied from a symmetrical clock or waveform to an unsymmetrical waveform in either direction from symmetry. This is accomplished merely by revising the amplitude of level 66 so that the triggering point to change the output to a positive value is altered.

While a specific embodiment of the present invention has been described, it is realized that other embodiments will occur to those skilled in the art. I therefore wish to be limited not by the specific embodiment illustrated but only by the scope of the claims wherein:

I claim:

1. Electronic oscillator apparatus comprising in combination:

means for supplying a control signal;

constant current generator means including control means and output means, whereby a current is supplied to said output means thereof in direct response to signals supplied to said control means thereof;

integration means connected to said output means of said constant current means for receiving charging currents therefrom;

means connecting said first named means to said control input of said constant current means for controlling the magnitude of current supplied from said constant current means to said integration means;

level detection means connected to said integration means for supplying a signal output when said integration means is charged to a predetermined magnitude;

level detector means for supplying a further signal output when the charge accumulated by said integration means is at a pre-determined value which is different from that to which said level detection means is sensitive, the further output providing a rectangular waveform signal of a frequency directly proportional to the charge rate of said integration means; and discharging means responsive to said signal output from said level detection means for discharging said integration means, the frequency of discharge varying from a minimum to a maximum value in accordance with said control signal.

2. Apparatus as claimed in claim 1 wherein each of said level detector means and level detection means comprise a differential amplifier having two inputs wherein one input of each is connected to different reference voltage levels and the other input of each is connected to receive the signal indicative of the charge of said integration means.

3. Apparatus as claimed in claim 1 wherein the voltage level to which said level detector means is sensitive is an amplitude other than one-half the amplitude to which said level detection means is sensitive whereby the rectangular waveform output signal is unsymmetrical.

4. Apparatus as claimed in claim 1 wherein said level detector includes a J-K flip-flop having its J and K inputs connected to the Q output thereof, a set input is connected to said level detection means for receiving the signal output thereof and said rectangular waveform is obtained from the $\overline{Q}$ output.

5. Variable frequency oscillator apparatus comprising in combination:

means for supplying power between first and second terminal means;

controllable constant current means; integrator capacitor means;

means for connecting said constant current means and said integrating capacitor means in series between said first and second terminal means;

minimum charge impedance means connected in parallel with said constant current means;

means for supplying a control signal to adjust the current flow through said constant current transistor means;

isolation amplifier means including field effect transistor means and including signal input and signal output means;

apparatus output means;

means connecting said isolation amplifier means between said integrator means and said apparatus output means whereby signals are received at said apparatus output means indicative of voltage variations of said integrator means resulting from current charge accumulations from said constant current means;

voltage reference means;

differential amplifier means connected to said apparatus output means and to said reference voltage means whereby an output signal is supplied by said differential amplifier means as the potential at one input thereof changes in polarity with respect to the potential at the other input thereof;

one-shot multivibrator means connected between said differential amplifier means and said integrator capacitor means for receiving an output signal from said differential amplifier means and discharging said integrator capacitor in response thereto.

6. Apparatus as claimed in claim 5 wherein:

said one-shot multivibrator means comprises a J-K flip-flop receiving input pulses at a clock input thereof, having set and J inputs connected to ground, having a Q output connected to said K input and said flip-flop supplying output pulses from a $\bar{Q}$ output;

said one-shot multivibrator means further comprises transistor switch means responsive to output pulses received from said $\bar{Q}$ output;

said constant current means comprises at least one transistor;

further power supply means having a polarity opposite from that supplied by first terminal means of said means for supplying power;

voltage limiting means; and means connecting said further power supply means, and said voltage limiting means to the output of said one-shot multivibrator means for quickly discharging said integrator capacitor means while establishing a consistent discharge potential from which said integrator capacitor commences to charge after each discharge thereof.

7. Electronic oscillator apparatus comprising in combination:

means for supplying a control signal;

constant current generator means including control means and output means, whereby a current is supplied to said output means thereof in direct response to signals supplied to said control means thereof;

integration means connected to said output means of said constant current means for receiving charging currents therefrom;

means connecting said first named means to said control input of said constant current means for controlling the magnitude of current supplied from said constant current means to said integration means;

level detection means connected to said integration means for supplying a signal output when said integration means is charged to a predetermined magnitude, said level detection means also including an isolation amplifier at the input thereof for receiving output signals from said integration means, said isolation amplifier supplying an apparatus output signal having a ramp waveform; and discharging means responsive to said signal output from said level detection means for discharging said integration means, the frequency of discharge varying from a minimum to a maximum value in accordance with said control signal, said discharging means also including a one-shot multivibrator means for assuring complete discharge of said integration means.

* * * * *